US009144926B2

(12) United States Patent
Yokota

(10) Patent No.: US 9,144,926 B2
(45) Date of Patent: Sep. 29, 2015

(54) FUNCTIONAL MOLDED ARTICLE AND METHOD FOR PRODUCING SAME

(75) Inventor: Tomoaki Yokota, Gojo (JP)

(73) Assignee: NIPPON VALQUA INDUSTRIES, INC., Tokyo (JP)

( * ) Notice: Subject to any disclaimer, the term of this patent is extended or adjusted under 35 U.S.C. 154(b) by 589 days.

(21) Appl. No.: 13/202,135

(22) PCT Filed: Feb. 15, 2010

(86) PCT No.: PCT/JP2010/052217
§ 371 (c)(1),
(2), (4) Date: Aug. 18, 2011

(87) PCT Pub. No.: WO2010/095601
PCT Pub. Date: Aug. 26, 2010

(65) Prior Publication Data
US 2011/0300388 A1    Dec. 8, 2011

(30) Foreign Application Priority Data

Feb. 19, 2009  (JP) ................................ 2009-036154
Mar. 31, 2009  (JP) ................................ 2009-087343

(51) Int. Cl.
| C08L 83/04 | (2006.01) |
| C08L 61/06 | (2006.01) |
| B29C 45/00 | (2006.01) |
| C08K 7/06 | (2006.01) |
| H01L 23/552 | (2006.01) |
| C08K 3/04 | (2006.01) |
| C08K 3/22 | (2006.01) |
| C08K 3/08 | (2006.01) |
| B29L 7/00 | (2006.01) |

(52) U.S. Cl.
CPC ......... B29C 45/0013 (2013.01); B29C 45/0005 (2013.01); *B29K 2827/18* (2013.01); *B29L 2007/00* (2013.01); *C08K 3/04* (2013.01); *C08K 7/06* (2013.01); *C08K 2003/0812* (2013.01); *C08K 2003/2227* (2013.01); *H01L 23/552* (2013.01); *H01L 2924/0002* (2013.01); *Y10T 428/31544* (2015.04)

(58) Field of Classification Search
USPC .......................................... 428/422; 156/243
See application file for complete search history.

(56) References Cited

FOREIGN PATENT DOCUMENTS

| JP | 46-008589 | * | 3/1971 |
| JP | 46-8589 | | 3/1971 |
| JP | 62-100529 | | 5/1987 |
| JP | 62-100539 | | 5/1987 |
| JP | 4-103312 | | 4/1992 |
| JP | 04-103312 | * | 4/1992 |
| JP | 5-4247 | | 1/1993 |
| JP | 5-295124 | | 11/1993 |
| JP | 07-003036 | * | 1/1995 |
| JP | 7-3036 | | 1/1995 |
| JP | 2002-502735 | | 1/2002 |
| JP | 2002-212370 | | 7/2002 |
| JP | 2002-212370 A | * | 7/2002 |
| JP | 2008-285562 | | 11/2008 |
| WO | 99/41071 | | 8/1999 |
| WO | WO 99/41071 | * | 8/1999 |

OTHER PUBLICATIONS

Derwent abstract of JP 2002-212370, Jul. 2002.*
International Search Report for PCT/JP2010/052217 dated Apr. 27, 2010.
Form PCT/IPEA/409 for PCT/JP2010/052217 dated Sep. 7, 2010.
Form PCT/IPEA/408 for PCT/JP2010/052217.

* cited by examiner

*Primary Examiner* — Peter D Mulcahy
*Assistant Examiner* — Henry Hu
(74) *Attorney, Agent, or Firm* — Roylance, Abrams, Berdo & Goodman, L.L.P.

(57) ABSTRACT

Provided are a functional molded article having sufficient flexibility and moldability and also sufficiently having the function of a functional particle, and a method for producing the same. The functional molded article is formed by molding a mixture containing a functional particle, a binder, and a fibrous substance. The method for producing the functional molded article essentially comprises a step of molding a mixture of a functional particle, a binder, and a fibrous substance, wherein the fibrous substance is obtained from a fibrous material which is formed into the fibrous substance by mechanical force applied in the process of obtaining the mixture, or essentially comprises a step of molding a mixture of a functional particle, a binder, and a fibrous substance, wherein the mixture is obtained by mixing the functional particle with the binder to form a premix and further mixing the premix with the fibrous substance or a fibrous material which is formed into the fibrous substance by mechanical force applied in the process of obtaining the mixture.

7 Claims, No Drawings

FUNCTIONAL MOLDED ARTICLE AND METHOD FOR PRODUCING SAME

TECHNICAL FIELD

The present invention relates to a functional molded article and a method for producing the same. More detailedly, it relates to a functional molded article utilized as a heat-conductive sheet, an electromagnetic wave shield, a flip chip, an electrode film, an electromagnetic wave absorber, a sensor, an antenna, an actuator, a gas barrier film or the like and a method for producing the same.

BACKGROUND ART

A substance obtained by binding functional particles having functionalities such as heat conductivity, electrical conductivity, magnetism, a dielectric property, a gas barrier property and the like by a binder and molding the same is widely known in general.

In the above, however, there has been such a problem that heat insulation or insulation is caused and the characteristics of the functional particles are inhibited if the quantity of the binder is large while flexibility, moldability etc. of an obtained functional molded article are reduced if the quantity of the binder is merely reduced.

In the meantime, there is also known a technique (refer to Patent Literature 1, for example) of blending functional particles into a fibrous substance, while no binder is employed in this technique and hence no inhibition of functionalities by a binder takes place. In a functional molded article obtained in this manner, however, there has been such a problem that the substance is torn or a fall of the functional particles takes place.

As another prior art of the functional molded article, there is known a functional molded article characterized in that functional particles are fixed to a porous body by fibrillated polytetrafluoroethylene (PTFE), although this is a technique different in a point of fixing the functional particles to a substrate consisting of the porous body thereby supplying functionalities from the aforementioned prior art employing no such substrate (refer to Patent Literature 2). According to this technique, it is assumed that a large quantity of functional powder is fixed to the porous body by a three-dimensional network structure of PTFE converted to a fine fibrous substance having adhesiveness due to the fibrillation and hence the whole surface of the functional powder is not covered with PTFE, the functions of the functional powder are not damaged, the functions of the functional powder are sufficiently exhibited with respect to a substance passing through the inner portion of the functional material or coming into contact with the functional material, and the functional powder does not easily fall in production or use of the functional material.

Similarly, there is also known a functional molded article characterized in that functional powder is fixed to a porous body by a mixture consisting of a binder and microfibril cellulose (MFC) as a technique employing a porous body (refer to Patent Literature 3). According to this technique, it is assumed that the functional powder is fixed to the porous body and a fall of the functional powder is reliably prevented due to adhesive force of the binder and bonding force and intertwining force of the microfibril of MFC, while the microfibril of MFC forms a three-dimensional netlike structure, incorporates the powder thereinto and maintains high porosity, and hence the surface of the functional powder is not covered with a film of the binder, and the functions of the functional powder are not damaged.

The aforementioned techniques are techniques of fixing functional particles to porous bodies and essentially employ porous bodies such as unwoven fabric, and hence the functional molded articles in these techniques have been poor in flexibility.

While a binder is common to a fibrous substance described later in a function of capturing functional particles as viewed in the examples of the prior art described above, the term "binder" does not include a fibrous substance in the present invention, after the conventional illustration. Further, a term "capturing material" is employed when generically referring to the two on the basis of common capturing functions of the two.

CITATION LIST

Patent Literature

PTL 1: Japanese Patent Laying-Open No. 5-4247
PTL 2: Japanese Patent Laying-Open No. 5-295124
PTL 3: Japanese Patent Laying-Open No. 7-3036

SUMMARY OF INVENTION

Technical Problem

Accordingly, a problem to be solved by the present invention is to provide a functional molded article and a method for producing the same, having sufficient flexibility and moldability and also sufficiently having functions of a functional particle.

Solution to Problem

The inventor has conducted deep studies in order to solve the aforementioned problem. As a result, the inventor has found that sufficient flexibility and moldability are obtained without employing a binder in excess dissimilarly to the prior art in order to bond functional particles to each other if a functional molded article is formed by molding a mixture containing a functional particle, a binder and a fibrous substance, whereby functions of the functional particle are not inhibited by the binder but desired functions can be excellent exhibited as a result.

In other words, a functional molded article according to the present invention is characterized in that the same is a molded article of a mixture containing a functional particle, a binder and a fibrous substance.

A method for producing a functional molded article according to the present invention is characterized in that the same essentially requires a step of molding a mixture of a functional particle, a binder and a fibrous substance and the said fibrous substance is obtained from a fibrosing material becoming the fibrous substance by mechanical force added in a process of obtaining the said mixture, or characterized in that the same essentially requires a step of molding a mixture of a functional particle, a binder and a fibrous substance and the said mixture is obtained by mixing a premixture obtained by mixing the functional particle with the binder further with the fibrous substance or a fibrosing material becoming the fibrous substance by mechanical force added in a process of obtaining the said mixture.

Advantageous Effects of Invention

According to the present invention, flexibility and moldability can be supplied without employing a binder of an excess quantity dissimilarly to the prior art, the functional particles can be sufficiently captured, and the various functions of the functional particles can be excellently exhibited.

Particularly in a heat-conductive sheet employing a heat-conductive particle as the functional particle, that having a crosslinked structure is so employed as a binder that the same is excellent in heat resistance and rubberlike elasticity and has sufficient heat conductivity. In particular, the quantity of the binder may be extremely small and hence a large quantity of the heat-conductive particle can be included, whereby a heat-insulating function by pores can be reduced, and extremely high heat conductivity can be exhibited. Further, no silicone rubber is employed, whereby formation of siloxane likely to contaminate the inner portion of an apparatus can be prevented.

DESCRIPTION OF EMBODIMENTS

While the functional molded article and the method for producing the same according to the present invention are now detailedly described, the scope of the present invention is not restricted to the description of these, and points other than the following illustration can be properly modified/embodied in a range not damaging the subject matter of the present invention.

[Functional Molded Article]

The functional molded article according to the present invention is formed by molding a mixture containing a functional particle, a binder and a fibrous substance.

Functions are not exhibited by carrying a mixture containing a functional particle, a binder and a fibrous substance on a porous body or the like dissimilarly to the prior art, but the functional molded article formed by molding the mixture containing the functional particle, the binder and the fibrous substance exhibits desired functions.

The fibrous substance, the binder and the functional particle as well as the method for producing the functional molded article and application thereof are now described.

<Fibrous Substance>

While raw materials for the fibrous substance are not particularly restricted, a fluorine-based polymer material, a silicone-based polymer material, an aromatic heterocycle-based polymer material, a thermosetting polymer material, a thermoplastic polymer material and a mixture of these can be listed, for example. Among these, the fluorine-based polymer material is particularly preferable in view of high heat resistance and freeness from outgassing of siloxane or the like. More specifically, fluorine-based resin such as polytetrafluoroethylene (PTFE), polychlorotrifluoroethylene (PCTFE), a tetrafluoroethylene-hexafluoropropylene copolymer (FEP), polyvinylidene fluoride (PVdF), polyvinyl fluoride (PVT), a tetrafluoroethylene-perfluorovinyl ether copolymer (PFA), an ethylene-tetrafluoroethylene copolymer (ETFE) or the like can be listed as the said fluorine-based polymer material, for example. Methyl-based silicone resin, methylphenyl-based silicone resin or the like can be listed as the silicone-based polymer material, and polyimide resin, phenolic resin or the like can be listed as the aromatic heterocycle-based polymer material. In a viewpoint of heat resistance and shape retainability of the fibrous substance under a high temperature, polytetrafluoroethylene is particularly preferable.

The fibrous substance can be obtained by fibrillating the aforementioned material for the fibrous substance by a known method.

More specifically, the fibrous substance can be obtained in the process of production of a functional material by employing a particulate resin material as the material for the fibrous substance as in the method for producing a functional molded article described later or a semifibrous resin material or a fibrous resin material which can be prepared by the following method, for example.

As the method for obtaining the aforementioned semifibrous resin material or the fibrous resin material, emulsion spinning is generally employed in a case of employing a fiber raw material such as polytetrafluoroethylene, for example, having no proper solvent for obtaining a solution as a spinning liquid and not exhibiting sufficient heat fluidity in heating to a high temperature exceeding a crystalline melting point. According to the emulsion spinning, the semifibrous resin material or the fibrous resin material is obtained by dispersing fine particles of the fiber raw material into an aqueous solution (viscose or the like is also employable) of a water-soluble polymer material (polyvinyl alcohol, alginate of soda or the like) playing the role of a matrix later with addition of a dispersant for preparing an emulsion spinning liquid and wet-spinning the same to a coagulation bath for the matrix polymer.

On the other hand, melt spinning of taking up a substance prepared by melting a fiber raw material, extruding the same from a nozzle into an air current and cooling the same into a fibrous shape, dry spinning of preparing a solution by dissolving a fiber raw material in a solvent and evaporating the solvent by extruding the solution from a nozzle into an air current, wet spinning of preparing a solution by dissolving a fiber raw material in a solvent and performing desolvation by extruding the solution from a nozzle into a coagulation bath thereby forming a fiber or the like may be employed as another general spinning so far as there is a proper solvent for obtaining a solution as a spinning liquid or the fiber raw material exhibits sufficient heat fluidity in heating to a high temperature exceeding a crystalline melting point, and which method is to be employed may be decided in response to heat stability or solubility of the fiber raw material.

<Binder>

While materials for the binder according to the present invention are not particularly restricted, a fluorine-based polymer material, a silicone-based polymer material, an aromatic heterocycle-based polymer material, a thermosetting polymer material, a thermoplastic polymer material and a mixture of these can be listed, for example. Among these, a fluorine-based binder made of the fluorine-based polymer material is particularly preferable in view of high heat resistance and freeness from outgassing of siloxane or the like. More specifically, a material prepared from thermosetting liquid rubber "SIFEL" by Shin-Etsu Chemical Co., Ltd. can be listed as the said fluorine-based polymer material as a commercially available product, for example, while a material prepared from a copolymer of vinylidene fluoride and hexafluoropropylene (including that having tetrafluoroethylene as a termonomer) (FKM), a copolymer (FFKM) of tetrafluoroethylene and perfluoromethyl vinyl ether or the like can be listed. Dimethyl silicone rubber, methylphenyl vinyl silicone rubber, fluorosilicone rubber or the like can be listed as the silicone-based polymer material, and phenolic resin or the like can be listed as the aromatic heterocycle-based polymer material. When the material for the binder according to the present invention is a liquid binder having crosslinkability, further, the obtained functional molded article is excellent in flexibility, rubberlike elasticity and tackiness, and has sufficient heat conductivity when applied as a heat-conductive sheet, for example. SIFEL, which is liquid and excellent in moldability and has self-crosslinkability, is particularly preferable.

While the said binder has a crosslinked structure when employing a binder material having crosslinkability for the purpose of attaining rubber elasticity or the like as described above, the crosslinkability of the binder material does not denote only self-crosslinkability, but may be hetero-crosslinkability, i.e., that capable of forming a crosslinked structure by action of a separately added crosslinking agent or the like.

The aforementioned crosslinked structure is generally formed in a molding step of sheeting or the like carried out after kneading the binder material and other raw materials, and the binder material may not have the crosslinked structure before molding (at the time of kneading with other raw materials or the like).

<Functional Particle>

While the functional particle according to the present invention is not particularly restricted, a functional particle having a functionality such as heat conductivity, electrical conductivity, magnetism, a dielectric property, a gas barrier property or the like can be listed, for example. More specifically, graphite, aluminum, aluminum oxide, magnesium oxide, aluminum hydroxide, boron nitride, aluminum nitride, zinc oxide, silica, mica, zinc white and the like can be listed, for example, and one or more of these can be employed together.

While the average particle diameter of the functional particle is not particularly restricted, an average particle diameter of 0.5 to 500 μm is preferable, and an average particle diameter of 1 to 100 μm is more preferable in a case of the heat-conductive particle or the like, for example. Dispersion of the functional particle may be defective if the average particle diameter is less than 0.5 μm, while smoothness of the sheet may be damaged if the average particle diameter exceeds 500 μm.

<Other Components>

The raw material for obtaining the functional molded article according to the present invention may contain other components such as a crosslinking agent, a crosslinking accelerator, a solvent, a dispersant, a plasticizer, an age resistor, a pigment and the like, in addition to the aforementioned fibrous substance, the binder and the functional particle.

In particular, plasticity is supplied by employing the plasticizer, whereby dispersibility of each component increases, while the moldability of the obtained mixture improves, and adhesiveness and tackiness of the obtained functional molded article improve. As the plasticizer, "Demnum" by Daikin Industries, Ltd., "Flonrube" by Asahi Glass Co., Ltd., "Fomblin" by Ausimont K.K., "Krytox" by E.I. du Pont de Nemours and Company or the like can be listed, for example.

<Production of Functional Molded Article>

The functional molded article according to the present invention can be produced as follows, for example:

In other words, employed is a method essentially requiring a step of molding a mixture of a functional particle, a binder and a fibrous substance, in which the said fibrous substance is obtained from a fibrosing material becoming the fibrous substance by mechanical force added in a process of obtaining the said mixture, or a method essentially requiring a step of molding a mixture of a functional particle, a binder and a fibrous substance, in which the said mixture is obtained by mixing a premixture obtained by mixing the functional particle with the binder further with the fibrous substance or a fibrosing material becoming the fibrous substance by mechanical force added in a process of obtaining the said mixture.

In a case of employing a fluid dispersion in which a resin material serving as the material for the said fibrous substance is contained as dispersoid in the above, this dispersion medium (solvent) can be evaporated/removed in a step before obtaining the functional molded article, or the molded article obtained by terminating the step of molding the said mixture can be consolidated.

In the method for producing a functional molded article according to the present invention, the premixture is preferably obtained by mixing the functional particle with the aforementioned binder, in order to reduce the usage of the binder. Thus, it is presumed that the functional particle is surface-coated with the binder. As a method of mixing the functional particle and the aforementioned binder with each other, the functional particle can be dispersed in the binder and mixed therewith with application of shearing force.

This premixture is mixed with the fibrous substance or the material for the fibrous substance. In this case, a particulate resin material finally becoming the fibrous substance, a semi-fibrous resin material finally becoming the fibrous substance or a fibrous resin material finally becoming the fibrous substance, or a fluid dispersion thereof can be employed as the material for the fibrous substance, for example. These resin materials are unfired, and elongates during kneading to complicatedly intertwine with the said premixture. Then, the resin materials can provide a strong structure as fiber when being fired by heat treatment such as heat pressing described later, for example. While the semifibrous resin material does not have a clear fiber structure as a whole, it is intended that the same includes that having a partially fibrosing structure.

As the method for producing a functional molded article according to the present invention, the following three types of methods can be specifically preferably illustrated, for example:

(1) A method of obtaining a premixture by mixing a functional particle and a binder with each other with a mixer having strong shearing force, thereafter mixing the premixture further with a resin material serving as the material for a fibrous substance, and molding the obtained final mixture.

(2) A method of mixing a premixture 1 obtained by mixing a functional particle and a binder with each other with a mixer having strong shearing force and a premixture 2 obtained by mixing a functional particle and a resin material serving as the material for a fibrous substance with each other, and molding the obtained final mixture.

(3) A method of mixing a functional particle, a binder and a resin material serving as the material for a fibrous substance dispersed in a solvent with each other, and molding the obtained final mixture after drying the solvent by air blowing or the like, or molding the obtained final mixture and thereafter drying the solvent by air blowing or the like.

The aforementioned method (1) is most preferable as a technique for obtaining a high-density functional molded article having a small number of pores since mixing is so performed with the mixer having strong shearing force that dispersibility of the functional particle in the binder is improved and hence the number of pores is remarkably reduced while the effect that a large quantity of the functional particle can be included, resulting from an intertwining effect of the functional particle by the fibrous substance is also exhibited.

Each of the aforementioned methods (2) and (3) is a technique capable of molding the functional particle without breaking the same even if the functional particle includes a particle easily broken by strong shearing force, and the functional particle easily broken by shearing such as graphite, fiber (carbon, metal) or hollow particles is employed as the functional particle not in the premixture 1 but in the premixture 2 so that a functional molded article in which the functional particle is efficiently included in high density can be obtained. However, the functional particle easily broken by shearing are not improved in dispersibility in the binder by mixing with a mixer having strong shearing force dissimilarly to the premixture 1, and hence the method is inferior in the effect of reducing the number of pores as compared with the aforementioned method (1), and consolidation must therefore be performed in a batch system. Further, the method is also slightly inferior in holdability (fall property) of the functional particle as compared with the aforementioned method (1).

In order to improve the holdability (fall property) of the functional particle consolidation is preferably performed after forming a layer (hereinafter referred to as a dustproof layer for simplification of the description) for preventing rising of dust from the inner portion on the surface in the aforementioned method (2) or (3). Thus, the holdability of the functional particle can be improved. In the aforementioned method (3), formation of the dustproof layer is preferably performed after evaporating/drying the solvent.

On the other hand, the aforementioned method (1) hardly forms pores although the same cannot be applied to a functional particle broken by mixing in a mixer having strong shearing force and hence a continuous system with hot air of an oven or the like is also available, whereby the aforementioned method (1) is most preferable also in productivity.

Specifically, the mixing with strong shearing force in the aforementioned method (1) or (2) is preferably in a Raikai mixer, a roll mill, a kneader, a Banbury mixer, a Henschel mixer, a planetary mixer or the like. The dispersibility of the functional particle into the binder is improved by the shearing effect thereof, to contribute to reduction in the number of pores. The said mixing with strong shearing force may be performed in a state of adding a volatilizable solvent. A rolling step in each of the aforementioned methods (1) to (3) is preferably carried out, specifically, by rolling, pressing or the like, for example, and the fibrous substance having fibrosed at the time of kneading with the remaining materials is further efficiently converted to long fiber due to the rolling action, to contribute to the effect that a large quantity of the functional particle can be included. Further, the fiber converted to the long fiber also plays the role of a bond for the functional molded article due to orientation action by the rolling, and hence the same brings high moldability also in a case of preparing the binder from an extremely fragile substance such as gel or a substance hardly moldable when being included in high amount, for example. While a particulate resin material is preferably employed as the resin material serving as the material for the fibrous substance in consideration of dispersibility, a resin material in a state dispersed in a solvent or a fibrous resin material may also be employed.

In the above, the average particle diameter of the material for the fibrous substance is preferably 0.01 to 50 μm, and more preferably 0.01 to 5 μm, for example, in view of dispersibility or the like.

While the resin material becoming the said fibrous substance may not become complete fiber but particulate portions may partially remain, for example, this case is also included in the concept of the fibrous substance in the present invention.

As to the compounding ratios of the fibrous substance and the binder and the functional particle in the functional molded article obtained in the aforementioned manner, the content of the functional particle is preferably 100 to 1800 parts by volume with respect to 100 parts by volume of the total quantity of the fibrous substance and the hinder, and more preferably 300 to 1000 parts by volume. Various functionalities may be insufficient if the content of the functional particle is less than 100 parts by volume, while smoothness, flexibility or moldability of the functional molded article may be damaged or a fall of the functional particles may be caused if the content exceeds 1800 parts by volume. The compounding ratio of the fibrous substance and the binder is preferably fibrous substance:binder=5:1 to 1:20 with reference to volumes, and more preferably 2:1 to 1:10. The number of pores in the functional molded article may so increase that various functionalities lower or performance (rubberlike elasticity or the like) brought by the binder may be damaged if the compounding ratio of the fibrous substance is excessively large (if the ratio of the binder is excessively small), while it may become difficult to include the functional particle in high amount and various functions of the functional particle may lower if the compounding ratio of the fibrous substance is excessively small (if the ratio of the binder is excessively large).

The compounding ratio of the binder is preferably not more than 100 parts by volume with respect to 100 parts by volume of the functional particle. Various functions of the functional particle lower if the compounding ratio of the binder with respect to the functional particle is excessively large. The compounding ratio is more preferably 5 to 30 parts by volume.

In a case of utilizing the functional molded article according to the present invention as a high-density functional molded article, porosity is preferably not more than 30 volume %, and more preferably 0 to 5 volume %. This porosity is a value measured by a method employed in Examples.

<Application of Functional Molded Article>

The functional molded article can be suitably utilized as a functional molded article or the like utilized as a heat-conductive sheet, an electromagnetic wave shield, a flip chip, an electrode film, an electromagnetic wave absorber, a sensor, an antenna, an actuator, a gas barrier film or the like, can be stuck to various substrates to exhibit various functions, and can also be used as a sealing material.

A molding technique for performing sheeting or the like is not particularly restricted but compression molding, extrusion molding, injection molding, cast molding, blow molding, calender molding or the like can be employed, while coating, printing, dispensing, potting or the like can also be employed if the raw material mixture is liquid.

It is difficult to obtain an extremely high-density functional molded article by the aforementioned method (2) or (3) dissimilarly to the aforementioned method (1), and hence consolidation such as a method of preparing a low-density functional molded article by rolling a raw material mixture with a calendering machine or the like, cutting the functional molded article and pressing the same with a press thereby preparing a high-density functional molded article, for example, can be listed as a particularly preferable molding technique. The said pressing step may be carried out after overlapping a plurality of low-density functional molded articles, or the binder can be crosslinked in this pressing step by employing heat pressing (in a case of heat crosslinkability) or applying ultraviolet rays or the like in pressing (in a case of ultraviolet crosslinkability).

In the aforementioned method (1), a high-density functional molded article can be obtained without the aforementioned step of pressing or the like as described above, and hence a molded article can be continuously obtained by only extrusion molding or the like.

Such a high-density functional molded article is suitably employed for a heat-conductive sheet which must suppress heat insulation with air or a sealing material to which airtightness and water tightness are required, in particular.

An article having desired characteristics such as rubberlike characteristics or gelatinous characteristics can be obtained as a functional molded article by adjusting conditions and materials at the time of obtaining the functional molded article, specifically the type and crosslinking density of the binder, the presence or absence of addition of a plasticizer and the like, for example. These characteristics are so selected depending on the application that such an advantage can be obtained that extremely high heat conductivity can be exhibited by employing a gelatinous functional molded article excellent in tackiness, adhesiveness, shape followability and the like in application to a heat-conductive sheet, for example.

While the thickness in a case of employing the functional molded article as a functional sheet is not particularly restricted, the same is preferably set to 20 to 2000 μm, and more preferably set to 50 to 1000 μm in a case of a heat-conductive sheet or the like, for example. Sheet strength may be excessively weakened to cause breakage or cracking if the thickness is less than 20 μm, while transmission of various functions of the functional particle in the sheet may be insufficient to lead to insufficient practicality if the thickness exceeds 2000 μm.

The functional molded article according to the present invention can be used for various applications in response to the target functions, for example, and is so interposed between a heat generator such as an electronic component and a heat radiator such as a heat sink or a heat pipe in a case of employing the same as a heat-conductive sheet, for example, to suitably effectively perform heat conduction therebetween. As a covered object, there is a portable telephone, a circuit board or the like, for example.

EXAMPLES

While the present invention is now more specifically described with reference to Examples and Comparative Examples, the present invention is not restricted to these.

Example 1

A premixture was obtained by mixing 30 weight % (specific gravity 2.2, 31 volume %) of sphericalized graphite having an average particle diameter of 200 μm, 12 weight % (specific gravity 2.2, 12 volume %) of sphericalized graphite having an average particle diameter of 50 μm, 8 weight % (specific gravity 2.2, 8 volume %) of sphericalized graphite having an average particle diameter of 20 μm and 30 weight % (specific gravity 2.7, 25 volume %) of aluminum having an average particle diameter of 10 μm with 10 weight % (specific gravity 1.8, 13 volume %) of SIFEL (thermosetting liquid fluorine-based rubber, by Shin-Etsu Chemical Co., Ltd.), thereafter 90 weight % of a fluid dispersion containing 10 weight % (specific gravity 2.2, 10 volume %) of PTFE particles was added to this premixture and kneaded, and the mixture was rolled. This final mixture was dried for one day by air blowing thereby removing moisture, and SIFEL was crosslinked by performing heat pressing with a pressure of 2.8 MPa at a temperature of 170° C., thereby obtaining a heat-conductive sheet according to Example 1 whose sheet thickness was 279 μm.

When thermogravimetry was executed as to the heat-conductive sheet according to Example 1 under a nitrogen gas atmosphere at a rise temperature of 10° C./min. to calculate by what % the weight was reduced with respect to the initial weight upon temperature rise to 300° C., it was confirmed that the sheet was not reduced in weight but had sufficient heat resistance.

Example 2

A heat-conductive sheet according to Example 2 whose sheet thickness was 300 μm was obtained similarly to Example 1, except that the sheet thickness was changed to 300 μm.

It was confirmed that the heat-conductive sheet according to Example 2 had sufficient heat resistance in heat resistance evaluation according to a method equivalent to that for Example 1.

Example 3

A suspension containing a composite of PTFE fiber and graphite was obtained by mixing/stirring 80 weight % of a fluid dispersion containing 30 weight % (specific gravity 2.2, 31 volume %) of sphericalized graphite having an average particle diameter of 200 μm, 10 weight % (specific gravity 2.2, 12 volume %) of sphericalized graphite having an average particle diameter of 50 μm, 8 weight % (specific gravity 2.2, 8 volume %) of sphericalized graphite having an average particle diameter of 20 μm and 10 weight % (specific gravity 2.2, 10 volume %) of PTFE particles and making the PTFE particles in the fluid dispersion fibrose. This suspension was dried for half a day at 300° C., thereby removing moisture. The obtained composite of PTFE fiber and graphite was pulverized with a pulverizer, and adjusted to an average particle diameter of 180 μm.

Then, a mixture was obtained by kneading 30 weight % (specific gravity 2.7, 25 volume %) of aluminum having an average particle diameter of 10 μm and 10 weight % (specific gravity 1.8, 13 volume %) of SIFEL (thermosetting liquid fluorine-based rubber, by Shin-Etsu Chemical Co., Ltd.) with a Raikai mixer for one hour, thereafter 60 weight % (61 volume %) of the previously prepared composite of PTFE fiber and graphite was added to this mixture and kneaded to roll the mixture, and SIFEL was crosslinked by performing heat pressing with a pressure of 2.8 MPa at a temperature of 170° C., thereby obtaining a heat-conductive sheet according to Example 3 whose sheet thickness was 300 μm.

It was confirmed that the heat-conductive sheet according to Example 3 had sufficient heat resistance in heat resistance evaluation according to a method equivalent to that for Example 1.

Example 4

A mixture was obtained by mixing 14 weight % (specific gravity 1.8, 25 volume %) of SIFEL (thermosetting liquid fluorine-based gel, by Shin-Etsu Chemical Co., Ltd.), 6 weight % (specific gravity 2.0, 9.5 volume %) of Demnum grease (perfluoropolyether-based fluorine-based grease, by Daikin Industries, Ltd.), 47 weight % (specific gravity 3.97, 38 volume %) of aluminum oxide having an average particle diameter of 18 μm, 31 weight % (specific gravity 3.97, 25 volume %) of aluminum oxide having an average particle diameter of 3 μm and 0.5 weight % (specific gravity 2.2, 0.5 volume %) of vapor-growth carbon fiber with a Raikai mixer for one hour and thereafter mixing the same while adding 1.5 weight % (specific gravity 2.2, 2 volume %) of PTFE particles (average particle diameter 500 μm). Then, a laminate sheet was obtained by putting the obtained mixture between polyester-based mold-releasing films and rolling the same. This laminated sheet was crosslinked with heat of a heater at 150° C. for one hour, thereby obtaining a laminated substance of a gelatinous heat-conductive sheet. The thickness of a heat-conductive sheet according to Example 4 obtained by removing the polyester-based mold-releasing films was 300 μm.

It was confirmed that the heat-conductive sheet according to Example 4 had sufficient heat resistance in heat resistance evaluation according to a method equivalent to that for Example 1.

When tack strength at a time of loading 100 gf was measured as to the heat-conductive sheet according to Example 4 in accordance with ES Z3284, excellent tackiness of 11 gf was recognized.

When a measuring sample having a thickness of 2 mm in total was prepared by overlapping four sheets of 300 μm in thickness so that no bubbles were introduced between the sheets as to the heat-conductive sheet according to Example 4 and reading after one second was measured with an ASKER C hardness meter (by Kobunshi Keiki Co., Ltd.), excellent hardness of 68 was obtained.

Example 5

A laminated substance of a gelatinous heat-conductive sheet was obtained similarly to Example 4, except that employed materials were changed to 12.5 weight % (specific gravity 1.8, 22.5 volume %) of SIFEL (thermosetting liquid fluorine-based gel, by Shin-Etsu Chemical Co., Ltd.), 5.5 weight % (specific gravity 2.0, 9 volume %) of Demnum grease (perfluoropolyether-based fluorine-based grease, by Daikin Industries, Ltd.), 48 weight % (specific gravity 3.97, 39.5 volume %) of aluminum oxide having an average particle diameter of 18 μm, 32 weight % (specific gravity 3.97, 26 volume %) of aluminum oxide having an average particle diameter of 3 μm, 0.5 weight % (specific gravity 2.2, 0.5 volume %) of vapor-growth carbon fiber and 1.5 weight % (specific gravity 2.2, 2 volume %) of PTFE particles (average particle diameter 500 μm). The thickness of a heat-conductive sheet according to Example 5 obtained by removing polyester-based mold-releasing films was 300 μm.

It was confirmed that the heat-conductive sheet according to Example 5 had sufficient heat resistance in heat resistance evaluation according to a method equivalent to that for Example 1.

When tack strength was measured as to the heat-conductive sheet according to Example 5 by a method equivalent to that for Example 4, excellent tackiness of 12 gf was recognized.

When hardness was further measured as to the heat-conductive sheet according to Example 5 by a method equivalent to that for Example 4, excellent hardness of 60 was obtained.

Example 6

A suspension containing a composite of PTFE fiber and graphite was obtained by mixing/stirring 130 weight % of a fluid dispersion containing 30 weight % (specific gravity 2.2, 34 volume %) of sphericalized graphite having an average particle diameter of 50 μm, 20 weight % (specific gravity 2.2, 23 volume %) of sphericalized graphite having an average particle diameter of 20 μm and 10 weight % (specific gravity 2.2, 11 volume %) of PTFE particles and making the PTFE particles in the fluid dispersion fibrose. This suspension was dried for half a day at 300° C., thereby removing moisture. The obtained composite of PTFE fiber and graphite was pulverized with a pulverizer, and adjusted to an average particle diameter of 180 μm.

Then, a mixture was obtained by kneading 30 weight % (specific gravity 3.97, 19 volume %) of aluminum oxide having an average particle diameter of 3 μm and 10 weight % (specific gravity 1.8, 14 volume %) of SIFEL (thermosetting liquid fluorine-based rubber, by Shin-Etsu Chemical Co., Ltd.) with a Raikai mixer for one hour, and 60 weight % (68 volume %) of the previously prepared composite of PTFE fiber and graphite was thereafter added to this mixture and kneaded, to roll the mixture.

Then, a paint for obtaining a dustproof layer was prepared by blending 95 weight % of fluorine rubber (trade name "Diel G912", by Daikin Industries, Ltd.), 4 weight % of a crosslinking assistant (trade name "TAIC", by Nippon Kasei Chemical Co., Ltd.), 1 weight % of a crosslinking agent ("Perhexa 25B", by Nippon Oil and Fats Co., Ltd.) and 810 weight % of 2-butanone, this was applied to the surface of the aforementioned rolled sheet with a thickness of 2 μm and dried/hardened, and SIFEL was thereafter crosslinked by performing heat pressing with a pressure of 2.8 MPa at a temperature of 170° C., thereby obtaining a heat-conductive sheet according to Example 6 whose sheet thickness was 330 μm.

It was confirmed that the heat-conductive sheet according to Example 6 had sufficient heat resistance in heat resistance evaluation according to a method equivalent to that for Example 1.

Comparative Example 1

30 weight % (specific gravity 2.2, 32 volume %) of sphericalized graphite having an average particle diameter of 200 μm, 12 weight % (specific gravity 2.2, 13 volume %) of sphericalized graphite having an average particle diameter of 50 μm, 8 weight % (specific gravity 2.2, 8 volume %) of sphericalized graphite having an average particle diameter of 20 μm and 30 weight % (specific gravity 2.7, 26 volume %) of aluminum having an average particle diameter of 10 μm were added to 130 weight % of a fluid dispersion containing 20 weight % (specific gravity 2.2, 21 volume %) of PTFE particles and kneaded, and the mixture was thereafter rolled. This final mixture was dried for one day by air blowing thereby removing moisture, and further pressed with a pressure of 2.8 MPa, for obtaining a heat-conductive sheet according to Comparative Example 1 whose sheet thickness was 300 μm.

Comparative Example 2

A heat-conductive sheet according to Comparative Example 2 whose sheet thickness was 300 μm was obtained similarly to Comparative Example 1, except that employed materials were changed to 130 weight % of a fluid dispersion containing 10 weight % (specific gravity 2.2, 11 volume %) of PTFE particles, 34 weight % (specific gravity 2.2, 36 volume %) of sphericalized graphite having an average particle diameter of 200 μm, 13 weight % (specific gravity 2.2, 14 volume %) of sphericalized graphite having an average particle diameter of 50 μm, 9 weight % (specific gravity 2.2, 10 volume %) of sphericalized graphite having an average particle diameter of 20 μm and 34 weight % (specific gravity 2.7, 30 volume %) of aluminum having an average particle diameter of 10 μm.

Comparative Example 3

A heat-conductive sheet according to Comparative Example 3 whose sheet thickness was 300 μm was obtained similarly to Comparative Example 1, except that employed materials were changed to 120 weight % of a fluid dispersion containing 20 weight % (specific gravity 2.2, 20 volume %) of PTFE particles, 48 weight % (specific gravity 2.2, 48 volume %) of sphericalized graphite having an average particle diameter of 200 μm, 19 weight % (specific gravity 2.2, 19 volume %) of sphericalized graphite having an average particle diameter of 50 μm and 13 weight % (specific gravity 2.2, 13 volume %) of sphericalized graphite having an average particle diameter of 20 μm.

Comparative Example 4

A mixture was obtained by mixing 15.5 weight % (specific gravity 1.8, 27 volume %) of SIFEL (thermosetting liquid fluorine-based gel, by Shin-Etsu Chemical Co., Ltd.), 6 weight % (specific gravity 2.0, 9.5 volume %) of Demnum grease (perfluoropolyether-based fluorine-based grease, by Daikin Industries, Ltd.), 47 weight % (specific gravity 3.97, 38 volume %) of aluminum oxide having an average particle diameter of 18 μm, 31 weight % (specific gravity 3.97, 25 volume %) of aluminum oxide having an average particle diameter of 3 μm and 0.5 weight % (specific gravity 2.2, 0.5 volume %) of vapor-growth carbon fiber with a Raikai mixer for one hour. Then, lamination was attempted by putting the obtained mixture between polyester-based mold-releasing films and rolling the same. However, the said mixture was a gelatinous substance, which was so extremely fragile that breakage took place throughout a sheet when roll molding was attempted, and it was impossible to obtain a sheeted substance.

Comparative Example 5

A heat-conductive sheet according to Comparative Example 5 whose sheet thickness was 300 μm was obtained by mixing 50 weight % (specific gravity 1.8, 60 volume %) of G901 (ternary fluorine rubber of tetrafluoroethylene-hexafluoroethylene-vinylidene fluoride, by Daikin Industries, Ltd.) and 50 weight % (specific gravity 1.8, 40 volume %) of aluminum having an average particle diameter 10 μm with a kneading roll for 20 minutes and rolling the same.

[Evaluation]

Table 1 shows execution conditions of the aforementioned Examples 1 to 6 and Comparative Examples 1 to 5. Referring to Table 1, all descriptions related to blending are in volume %.

As to each of the heat-conductive sheets according to the aforementioned Examples 1 to 6 and Comparative Examples 1 to 5, heat conductivity, porosity and a dustproof property were measured and evaluated as described below. Table 1 also shows the results.

TABLE 1

| | | | Example 1 | Example 2 | Example 3 | Example 4 | Example 5 | Example 6 | Comparative Example 1 | Comparative Example 2 | Comparative Example 3 | Comparative Example 4 | Comparative Example 5 |
|---|---|---|---|---|---|---|---|---|---|---|---|---|---|
| (a) Functional Powder 1 (strength low) | Sphericalized Graphite | 200 μm | 31 | 31 | 31 | | | | 32 | 36 | 48 | | |
| | | 50 μm | 12 | 12 | 12 | | | 34 | 13 | 14 | 19 | | |
| | | 20 μm | 8 | 8 | 8 | | | 23 | 8 | 10 | 13 | | |
| (a) Functional Powder 2 (strength high) | Al | 10 μm | 25 | 25 | 25 | | | | 26 | 30 | | | 40 |
| | Al$_2$O$_3$ | 18 μm | | | | 38 | 39.5 | | | | | 38 | |
| | | 3 μm | | | | 25 | 26 | 19 | | | | 25 | |
| (a) Functional Powder (total) | | | 76 | 76 | 76 | 63 | 65.5 | 76 | 79 | 90 | 80 | 63 | 40 |
| (b) Binder | Rubber | SIFEL | 13 | 13 | 13 | | | 14 | | | | | |
| | Gel | SIFEL | | | | 25 | 22.5 | | | | | 27 | |
| | | FKM G901 | | | | | | | | | | | 60 |
| (c) Fibrous Substance | PTFE Particles (500 μm) | Wet Mixing | 10 | 10 | 10 | | | 11 | 21 | 11 | 20 | | |
| | | Dry Mixing | | | | 2 | 2 | | | | | | |
| (b) + (c) Capturing Material (total) | | | 23 | 23 | 23 | 27 | 24.5 | 25 | 21 | 11 | 20 | 27 | 60 |
| Other Components | Grease | | | | | 9.5 | 9 | | | | | 9.5 | |
| | Pigment/Carbon Fiber (VGCF) | | | | | 0.5 | 0.5 | | | | | 0.5 | |
| Working Method | Mixing with Raikai Mixer | | | | yes | yes | yes | yes | | | | yes | |
| | Dustproof Layer | | | | | | | yes | | | | | |
| Performance Evaluation | Sheet Thickness (μm) | | 279 | 300 | 300 | 300 | 300 | 330 | 300 | 300 | 300 | 300 | 300 |
| | Heat Conductivity (W/m · K) | | 1.4 | 1.4 | 2.0 | 2.0 | 2.2 | 1.8 | 0.9 | 1.0 | 0.7 | unmoldable | 0.3 |
| | Porosity (volume %) | | 30 | 30 | 16 | 0 | 0 | 18 | 48 | 52 | 60 | | 0 |
| | Dustproof Property | | ○ | ○ | ○ | ◎ | ◎ | ◎ | X | X | X | | ◎ |

<Heat Conductivity>

The heat conductivity was measured according to ASTM D5470. More specifically, each heat-conductive sheet of 10 mm by 10 mm was held between a heater and a cooling member, and temperatures of the heater and the cooling member were measured after applying power of 45 V while applying pressure of 98 kPa and holding the sheet for 10 minutes, to measure the heat conductivity (W/m·K) of each heat-conductive sheet from the values and the following formula:

$$\text{Heat conductivity } (W/m \cdot K) = (W \times t)/(S \times (T_1 - T_2))$$

In the above, W (W) = heater applied voltage (45 V) × current (A), t (m) = sheet thickness in compression, S (m$^2$) = heating surface area (1.0×10$^{-4}$ m$^2$), T$_1$ (° C.) = heater-side temperature, and T$_2$ (° C.) = cooling member-side temperature.

<Porosity>

The porosity was calculated according to the following formula:

$$\text{Porosity } (\%) = \{1 - (\text{measured specific gravity of sheet}/\text{true specific gravity of sheet})\} \times 100$$

In the above, the measured specific gravity of the sheet is a value measured with an Archimedes gravimeter. The true specific gravity of the sheet is a value calculated as follows:

True specific gravity of sheet =

$\sum$ (true specific gravity of each charged substance × volume of each charged substance) = true specific gravity of binder × volume of binder + true specific gravity of functional particle × volume of functional particle + true specific gravity of fibrous substance × volume of fibrous substance + true specific gravity of other components × volume of other components <Dustproof Property>

The dustproof property was determined with reference to whether or not a sheet composition was transferred to a paper when rubbing the sheet against the paper, to evaluate a case where the same was not transferred, a case where the same was hardly transferred and a case where the same was remarkably transferred were evaluated as ⊚, ○ and × respectively.

<Consideration of Evaluation Results>

The heat-conductive sheet according to each of Examples 1 to 6 had proper flexibility and moldability, and was excellent also in heat conductivity. The heat-conductive sheet also had such advantages that heat resistance was high and no siloxane was generated due to the employment of the fluorine-based raw material, while consolidation was also performed in addition to that the relative quantity of the binder with respect to the functional particle was small, and hence the sheet had a high density and the quantity of air in the sheet was small, whereby the sheet was extremely preferable as the heat-conductive sheet.

In Example 3, strong shearing force was applied by mixing aluminum and the binder with each other with the Raikai mixer, whereby homogeneous dispersibility of aluminum was high, and the porosity was lower than those in Examples 1 and 2. However, sphericalized graphite was also employed as the functional particle and this sphericalized graphite was mixed separately from aluminum since the same is cleaved in mixing when strong shearing force is applied by the Raikai mixer. Therefore, the sphericalized graphite was consolidated in order to further reduce the porosity, since the same cannot attain such high dispersibility as that of aluminum.

In each of Examples 4 and 5, only aluminum oxide having high strength was employed as functional powder, and hence all functional particles were homogeneously dispersed due to the strong shearing force by the Raikai mixer, whereby it was possible to continuously mold a sheet having no pores. Further, the PTFE fiber in the mixture was converted to long fiber in the rolling and the same was oriented to also play the role of a bond for the sheet, whereby fragility was improved and moldability was supplied, although the gelatinous binder was employed. The obtained sheet was gelatinous, and hence the same had high shape followability and adhesiveness.

As understood from the results of the evaluation item of the dustproof property, a fall of the functional particles was suppressed in each Example conceivably because the functional particles were strongly fixed by a capturing material. Particularly in each of Examples 4 and 5 in which the functional particles were sufficiently homogeneously dispersed in the sheets or Example 6 provided with the dustproof layer, a fall of the functional particles was extremely excellently suppressed.

In each of Comparative Examples 1 to 3 employing no binders, the number of pores between the functional particles was so large that air present in the pores contributed to heat insulation to deteriorate the heat conductivity. Further, the functional particles were insufficiently bonded to each other, and a fall of the functional particles was more remarkably observed as compared with Example 1.

Comparative Example 4 was extremely fragile and extremely inferior in moldability due to the employment of the gelatinous binder.

Comparative Example 5 is a technique having been conventionally carried out in general, and holds the functional particle with a large quantity of binder. As obvious from the results shown in Table 1, it is understood that the function of the functional particle was inhibited by the large quantity of binder.

INDUSTRIAL APPLICABILITY

The functional molded article and the method for producing the same according to the present invention can be preferably used as a functional sheet, a sealing material or the like and a method for producing the same, and can exhibit functions such as heat conduction, electrical conduction, magnetism, piezoelectricity, vibration control, sound insulation, sliding, friction, antiblocking, heat insulation, electromagnetic wave absorption, light scattering/reflection, thermal radiation, flame resisting, ultraviolet absorption, radiation absorption, antibacterial, sterilization, dehydration, deodorization, high specific gravity, a gas barrier and the like by selecting the functional particle, for example.

The invention claimed is:

1. A functional molded article comprising a functional particle, a fluorine-based binder having a crosslinked structure and a fibrous fluorine-based polymer, and being obtained by molding a mixture comprising said functional particle, said crosslinkable fluorine-based binder and said fibrous fluorine-based polymer,
    wherein the function of said functional particle is at least one selected from heat conductivity, electrical conductivity, magnetism, a dielectric property and a gas barrier property, and
    said functional particle and said fibrous fluorine-based polymer are dispersed into said fluorine-based binder.

2. The functional molded article according to claim 1, wherein
    the porosity in the functional molded article is not more than 30 volume %.

3. The functional molded article according to claim 1, wherein
    the content of said fluorine-based binder having a crosslinked structure is not more than 200 parts by volume with respect to 100 parts by volume of said functional particle.

4. The functional molded article according to claim 1, wherein
    the content of said fibrous fluorine-based polymer is not more than 100 parts by volume with respect to 100 parts by volume of said functional particle.

5. The functional molded article according to claim 1, wherein the shape of the functional molded article is sheet-like.

6. The functional molded article according to claim 5, wherein
    said functional particle has heat conductivity, the material for said fibrous fluorine-based polymer is polytetrafluoroethylene, and the functional molded article is a heat-conductive sheet.

7. The functional molded article according to claim 1, wherein
a layer for preventing rising of dust from the inner portion is provided on a surface of the functional molded article.

* * * * *